United States Patent [19]

Taneya et al.

[11] Patent Number: 4,764,936
[45] Date of Patent: Aug. 16, 1988

[54] SEMICONDUCTOR LASER ARRAY DEVICE

[75] Inventors: Mototaka Taneya, Nara; Mitsuhiro Matsumoto, Tenri; Hidenori Kawanishi, Higashiosaki; Sadayoshi Matsui, Tenri, all of Japan

[73] Assignee: Sharp Kabushiki Kaisha, Osaka, Japan

[21] Appl. No.: 901,759

[22] Filed: Aug. 28, 1986

[30] Foreign Application Priority Data

Sep. 6, 1985 [JP] Japan ................................. 60-197937

[51] Int. Cl.[4] ............................................. H01S 3/19
[52] U.S. Cl. ...................................... 372/50; 372/97
[58] Field of Search ................... 372/50, 23, 97, 29, 372/96

[56] References Cited

U.S. PATENT DOCUMENTS

Re.31806  1/1985  Scifres et al. .......................... 372/45
379,090   2/1974  Miller .................................... 372/45
4,277,762 7/1981  Scifres et al. .......................... 372/45

FOREIGN PATENT DOCUMENTS 203810 12/1986 European Pat. Off.

OTHER PUBLICATIONS

K. Matsuda, Appl. Phys Lett. 46:11 8-30.

Primary Examiner—James W. Davie
Assistant Examiner—Georgia Y. Epps
Attorney, Agent, or Firm—Ciotti & Murashige, Irell & Manella

[57] ABSTRACT

A semiconductor laser array device comprising an oscillation operating area provided with a plurality of first index-waveguides in a parallel manner and a non-oscillation operating area provided with a plurality of second index-waveguides in a parallel manner through which laser light produced in said oscillation operating area are guided through the waveguide from said oscillation operating area to the end facets of the second index-waveguides of said non-oscillation operating area, wherein the second index-waveguides are different in length between the adjacent waveguides and the end facet of each of the second index-waveguides does not function as a cavity facet of the laser but it functions as the light-emitting facet of the device.

3 Claims, 5 Drawing Sheets

Distance

Angle

Distance in the Lateral Direction

Far-Field Angle (Degrees)

SEMICONDUCTOR LASER ARRAY DEVICE

BACKGROUND OF THE INVENTION

1. Field of the invention:

This invention relates to a semiconductor laser array device which comprises a plurality of semiconductor lasers on a single substrate, thereby producing high output power light with a single narrow beam.

2. Description of the prior art:

Semiconductor laser devices which are useful as light sources for optical discs, laser printers, optical measuring systems, etc., must produce high output power. However, conventional semiconductor laser devices having a single waveguide structure can only produce low output power, 60-70 mW at their best, even taking into account their window effects and/or the reflectivity control at their facets. In order to oscillate laser light in a certain array mode (i.e., a 0° phase-shift mode, resulting in a single narrow beam with higher output power), semiconductor laser array devices, in which a plurality of waveguides are fabricated in a parallel manner to achieve an optical phase-coupling between the adjacent waveguides, have been studied. However, the optical phase-shift between the adjacent waveguides of these devices is, indeed, 180°, and output power light is emitted in a two-beam fashion having a certain angle therebetween, resulting in a far-field pattern having two peaks. Thus, this laser light cannot be condensed into a diffraction limited spot fashion by means of any known optical lens. In order to use these semiconductor laser array devices as light sources of optical discs, laser printers, etc., they must oscillate laser in a single array mode and emit output power light with a single narrow beam.

FIGS. 4 and 5 show a conventional semiconductor laser array device, which can be produced as follows: On the (001) plane of a p-GaAs substrate 101, an n+-$Al_{0.1}Ga_{0.9}As$ current blocking layer 102 having a thickness of 0.7 μm and an n-GaAs surface-protective layer 103 having a thickness of 0.1 μm are successively formed by liquid phase epitaxy. Then, three straight channels 108 are formed in a parallel manner through both the surface-protective layer 103 and the current blocking layer 102 into the p-GaAs substrate 101. Each of the channels 108 has a width of 4 μm and a depth of about 1 μm. The distance from the center of one channel to that of the adjacent channel is 5 μm. These channels 108 are disposed at right angles to the (110) plane which corresponds to each of the facets of the device. Then, on the n-GaAs surface-protective layer 103 including the channels 108, a p-$Al_{0.42}Ga_{0.58}As$ cladding layer 104 having a thickness of 0.2 μm in the portions out of the channels 108, a p- or n- $Al_{0.14}Ga_{0.86}As$ active layer 105 having a thickness of 0.08 μm, an n-$Al_{0.42}Ga_{0.58}As$ cladding layer 106 having a thickness of 0.8 μm and an n+-GaAs contact layer 107 having a thickness of 1.5 μm are successively formed by liquid phase epitaxy. Since the channels 108 are filled with the p-cladding layer 104, the surface of each of the layers 104, 105, 106 and 107 becomes flat. Then, the upper face of the contact layer 107 and the back face of the substrate 101 are subjected to a vapor deposition treatment with metal materials and then heated to form ohmic contacts thereon made of alloys of the metal materials, followed by cleaving at the (011) plane of the wafer, resulting in a conventional semiconductive laser array device.

The optical field distribution of beams oscillated by the conventional laser array device and the far-field pattern attained by the conventional laser array device are shown in FIGS. 6 and 7, respectively, indicating that the optical phase-shift between the adjacent waveguides is 180°.

The reason why the conventional semiconductor laser array device having a plurality of waveguides is operated in a 180° phase-shift mode is that laser light is absorbed by the optical coupling area between the adjacent waveguides, which makes threshold gain of the 180° phase-shift mode significantly low.

The above-mentioned phenomenon that the conventional laser array device is operated in a 180° phase-shift mode can be also explained by reference to FIG. 8, which shows the dependence of the threshold gain of all possible array modes ($\nu=1$, 2 and 3) of a triple lasing filament array on the difference in refractive index in the lateral direction. This dependence is obtained by a calculating analysis of the waveguides. It can be also seen from FIG. 8 that the conventional laser array device selectively and stably oscillates laser in a 180° phase-shift mode. As mentioned above, such a 180° phase-shift mode attains a far-field pattern having two peaks, which causes difficulty in condensing the laser light into a diffraction limited spot fashion by means of any known optical lens.

Moreover, the conventional laser array device oscillates laser light in an array mode other than the 0° phase-shift mode and the 180° phase-shift mode, thereby producing output light with a plurality of beams. In addition, two or more array modes are mixed without interference therebetween, thereby producing output light with broad beams.

A semiconductor laser array device having an effective index-guided structure in which optical loss in the optical coupling area is zero has been proposed, which is shown in FIG. 9. The production of this laser array device is as follows: On the (001) plane of an n-GaAs substrate 111, an n-$Al_xGa_{1-x}As$ cladding layer 112 having a thickness of 0.8 μm, an n- or p- $Al_yGa_{1-y}As$ active layer 113 having a thickness of 0.1 μm, a p-$Al_xGa_{1-x}As$ cladding layer 114 having a thickness of 0.8 μm, and a p+-GaAs contact layer 115 having a thickness of 0.1 μm are successively formed by a crystal growth technique such as metal organic-chemical vapor deposition (MOCVD), molecular beam epitaxy (MBE), liquid phase epitaxy (LPE), or the like. Then, ohmic contacts are formed on both sides of the wafer. Three mesa-stripes 116 are then formed in a parallel manner in the wafer by photolithography and a reactive ion-beam etching technique in such a manner that the portion of the p-cladding layer 114 corresponding to the outside of the mesa-stripes 116 has a thickness of 0.3 μm. Each of the mesa-stripes 116 has an width of 3 μm and a height 1.5 μm. The distance from the center of one mesa-stripe to that of the adjacent mesa-stripe is 4 μm. These mesa-stripes 116 are disposed in the <110> direction of the substrate 111. Then, cleavage is carried out at the (110) plane of the wafer to form a laser array device 117 having a cavity length of about 250 μm.

The oscillation transverse mode attained by this effective-index guided laser array device is composed of a plurality of array modes. This phenomenon can be explained as follows: This effective-index guided laser array device oscillates laser in all allowed array modes at the same time because the absorption of light at the optical coupling area does not occur and all of the allowed array modes have the same threshold gain, whereas the laser array device shown in FIG. 4 selectively oscillates laser light in a 180° phase-shift mode because laser light is significantly absorbed by the optical coupling area. The breadth of output beams produced by this laser array device which oscillates laser light in a plurality of array modes is several times that of diffraction limited value, which cause difficulty in practical use of the laser array device.

SUMMARY OF THE INVENTION

The semiconductor laser array device of this invention, which overcomes the above-discussed and numerous other disadvantages and deficiencies of the prior art, comprises an oscillation operating area provided with a plurality of first index-waveguides in a parallel manner and a non-oscillation operating area provided with a plurality of second index-waveguides in a parallel manner through which laser light produced in said oscillation operating area are guided through the waveguide from said oscillation operating area to the end facets of the second index-waveguides of said non-oscillation operating area, wherein the second index-waveguides are different in length between the adjacent waveguides and the end facet of each of the second index-waveguides does not function as a cavity facet of the laser but it functions as the light-emitting facet of the device.

In a preferred embodiment, the first index-waveguides are formed within the active layer corresponding to a plurality of parallel channels in a current and light blocking layer positioned near the active layer, and the second index-waveguides are composed of a plurality of parallel light-permeable ridges which have a refractive index larger than 1 and which are positioned on the corresponding extensions of said first index-waveguides.

In a preferred embodiment, the proportion of light reflected from the light-emitting facets of said second index-waveguides is 3% or less.

Thus, the invention described herein makes possible the objects of (1) providing a semiconductor laser array device comprising a plurality of waveguides in which the adjacent waveguides are different in length by $\lambda/2(N_{eff}-1)$ and the end of each waveguide does not constitute the cavity facet of the laser device but it constitutes a light-emitting facet of the device, so that the device can be operated in a 0° phase-shift mode, thereby stably producing high output power light with a single narrow beam; and (2) providing a semiconductor laser array device which is useful as alight source for optical discs, laser printers, etc., requiring laser oscillation in a single array mode therein and requiring a single narrow beam therein.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
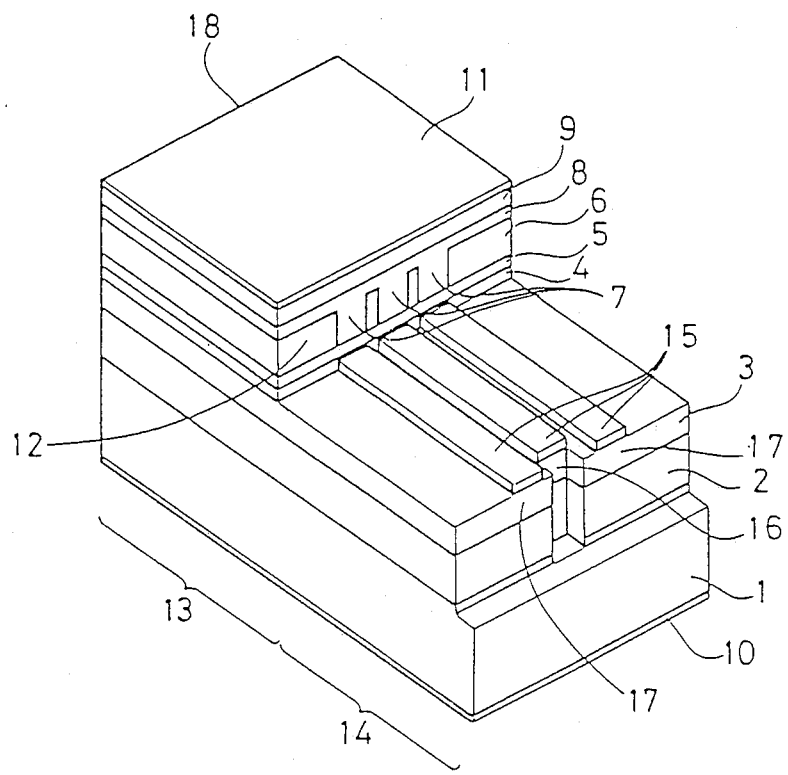
FIG. 1 is a perspective view showing a semiconductor laser array device of this invention.

FIG. 1 shows a semiconductor laser array device of this invention, which is produced as follows: On the (001) plane of an n-GaAs substrate 1, an n-$Al_xGa_{1-x}As$ cladding layer 2 having a thickness of 0.8 μm, an n-$Al_zGa_{1-z}As$ optical guiding layer 3 having a thickness of 0.3 μm, an n- or p- $Al_yGa_{1-y}As$ active layer 4 having a thickness of 0.06 μm, a p-$Al_xGa_{1-x}As$ first cladding layer 5 having a thickness of 0.2 μm, and an n+-GaAs current and light blocking layer 6 having a thickness of 0.6 μm are successively grown by a crystal growth technique such as metal organic-chemical vapor deposition (MOCVD), molecular beam epitaxy (MBE), liquid phase epitaxy (LPE), or the like. Then, three channels 7 are formed in a parallel manner in the current & light blocking layer 6 in a manner to reach the p-first cladding layer 5 by photolithography and an etching technique. Each of the channels 7 has a width of 3 μm and the distance from one channel to the adjacent channel is 2 μm. Then, on the current and light blocking layer 6 including the channels 7, a p-$Al_xGa_{1-x}As$ second cladding layer 8 and a p+-GaAs contact layer 9 are successively formed by metal organic-chemical vapor deposition (MOCVD). The channels 7 are filled with the p-second cladding layer 8. Then, ohmic contacts 10 and 11 are formed on the whole area of the back face of the substrate 1 and the whole area of the upper face of the contact layer 9, respectively.

Then, a facet 12 is formed at right angles to each of the crystal growth layers in the center of the wafer by photolithography and an etching technique, in a manner to reach the n- or p- active layer 4 through the layers 11, 9, 8, 6 and 5 or reach the inside of the n-optical guiding layer 3 through the layers 11, 9, 8, 6, 5 and 4. One half of the wafer constitutes an oscillation operating area 13 in which all of the crystal growth layers positioned above the active layer 4 or the optical guiding layer 3 remain without being etched. Another half of the wafer constitutes a non-oscillation operating area 14 in which all of the crystal growth layers positioned above the active layer 4 or the optical guiding layer 3 are removed by an etching treatment.

Then, a light-permeable layer having a refractive index (Ne) larger than 1 is formed on the exposed n-optical guiding layer 3 by the sputtering method, etc., followed by subjection to a photolithographic treatment and an etching treatment, resulting in three parallel ridges 15 constituting waveguides which are disposed on the corresponding extensions of the channels 7. The material for the ridges 15 is, for example, $TiO_2$.

Then, the wafer is subjected to a photolithographic treatment and a reactive ion-beam etching treatment to form facets 16 and 17 of the non-oscillation operating area 14 in such a manner that the length of the center waveguide 15 is shorter than that of each outer waveguide 15 by $\lambda/2(N_{eff}-1)$, wherein the facet 16 is positioned at a right angle to the center waveguide 15 at the end of the center waveguide 15 and the facets 17 are positioned at right angles to the outer waveguides 15 at the ends of the outer waveguides 15. $N_{eff}$ is the effective refractive index of the waveguides 15 of the non-oscillation operating area 14 and $\lambda$ is the oscillation wavelength. Thus, the facet 16 of the center waveguide 15 is closer to one cavity facet 12 of the oscillation operating area 13 than the facets 17 of the outer waveguides 15 by $\lambda/2$ $(N_{eff}-1)$.

Figure 4:
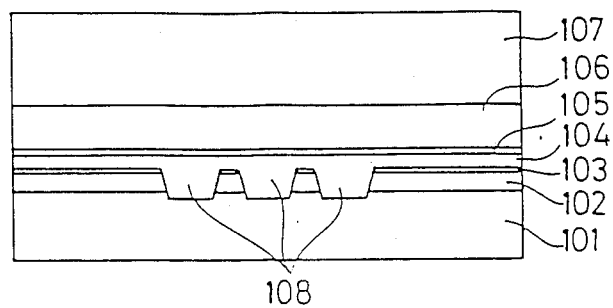
FIGS. 4 and 5, respectively, are a front sectional view and a perspective view showing a conventional semiconductor laser array device.
Figure 5:
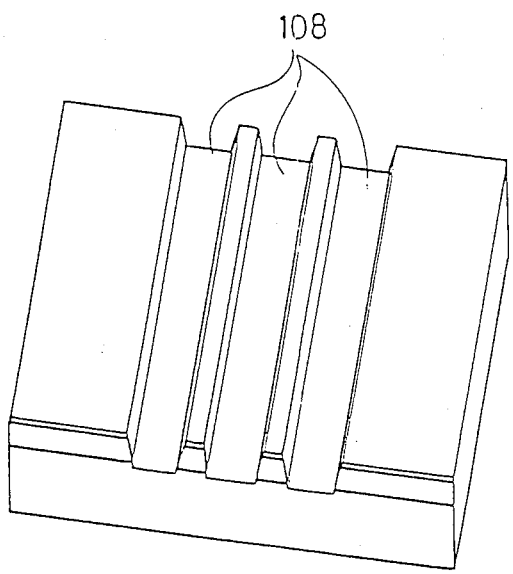
Figure 6:
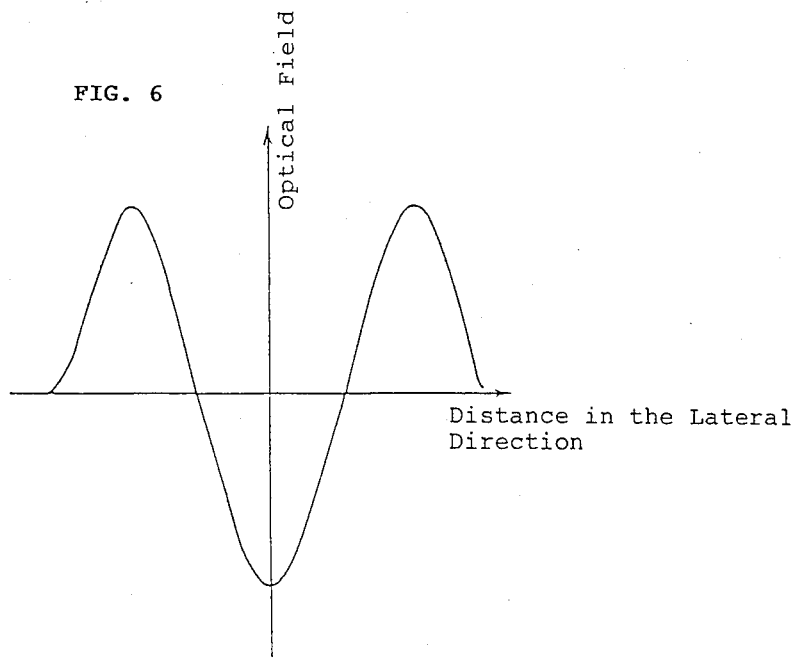
FIG. 6 is a graph showing the optical field distribution of the conventional semiconductor laser array device shown in FIG. 4.
Figure 7:
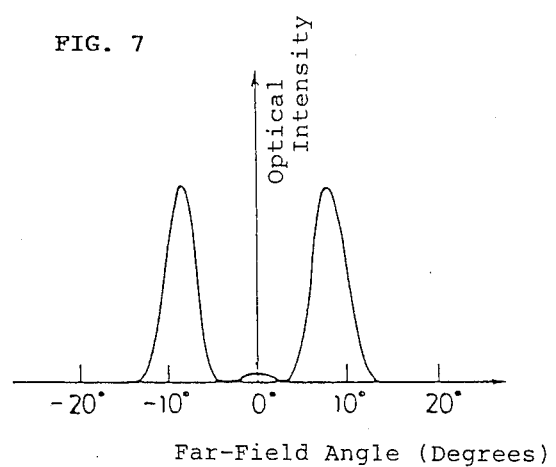
FIG. 7 is a graph showing the far-field pattern attained by the conventional semiconductor laser array device shown in FIG. 4.
Figure 8:
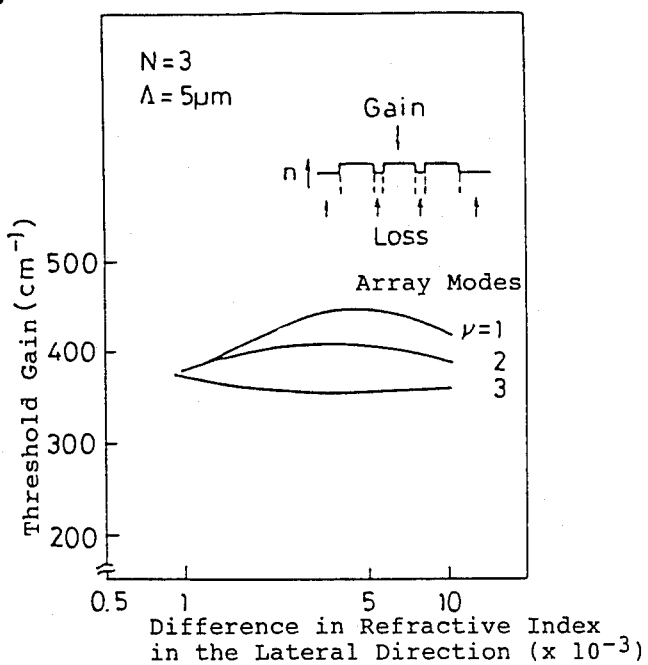
FIG. 8 is a graph showing the theoretical analysis of array mode threshold gain of the conventional semiconductor laser array device shown in FIG. 4.
Figure 9:
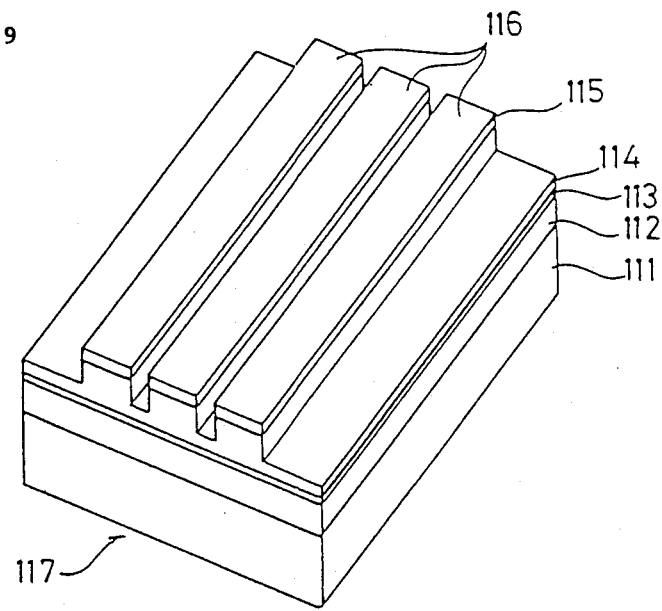
FIG. 9 is a perspective view showing another conventional semiconductor laser array device.

Then, another facet 18 of the oscillation operating area 13 is formed by cleavage. Reflecting films having a high reflectivity are formed on both facets 12 and 18 of the oscillation operating area 13 and reflection-blocking films having a reflectivity of as low as 3% or less are formed on the emitting facets 16 and 17 of the non-oscillation operating area 14, resulting in a semiconductor laser array device, in which the oscillation operating area 13 has the same operation as the conventional semiconductor laser array device shown in FIG. 4 and the non-oscillation operating area 14 guides laser lights, which have been produced in the oscillation operating area 13, through the waveguides 15 and emits the laser lights from the light-emitting facets 16 and 17.

The oscillation operating area 13 oscillates laser in a 180° phase-shift mode. However, the light-emitting facets (i.e., the end faces 16 and 17) of the non-oscillation operating area 14 are different in position therebetween by $\lambda/2(N_{eff}-1)$ from the cavity facet 12, so that the laser lights which were guided through the waveguide by the waveguides 15 from the oscillation operating area 13 to the end facets 16 and 17 of the non-oscillation operating area 14 can be converted from a 180° phase-shift mode to a 0° phase-shift mode and emitted in the 0° phase-shift mode from the light-emitting facets 16 and 17. The proportion of lights reflected from the light-emitting facets 16 and 17 is 3% or less.

Figure 2:
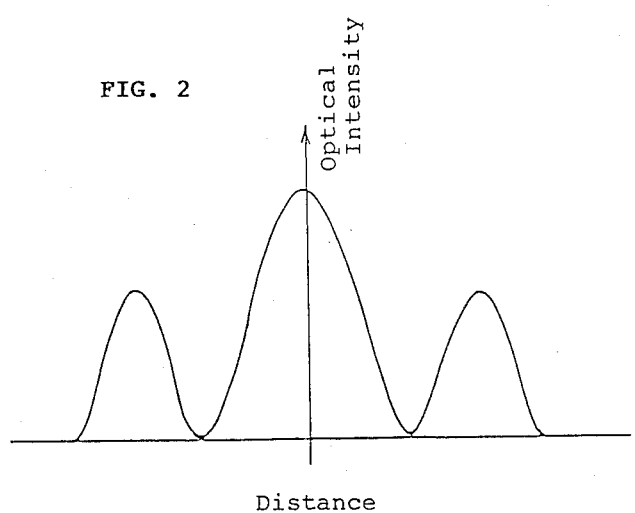
FIG. 2 is a graph showing the near-field pattern attained by the laser array device shown in FIG. 1.
Figure 3:
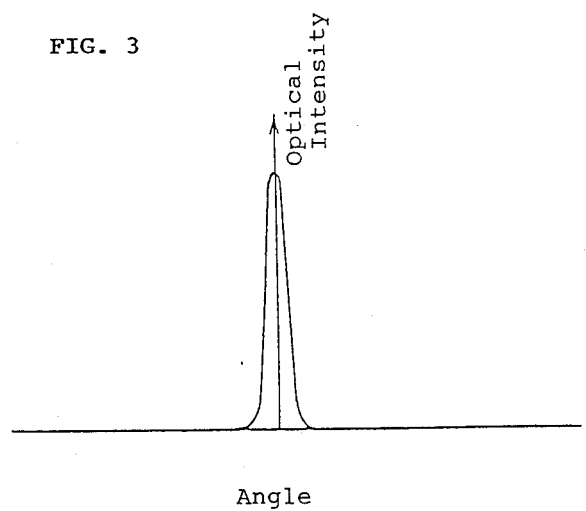
FIG. 3 is a graph showing the far-field pattern attained by the laser array device shown in FIG. 1.

FIGS. 2 and 3, respectively, show the near-field pattern and the far-field pattern attained by this semiconductor laser array device, indicating that the far-field pattern exhibits a single peak. Thus, this semiconductor laser array device can stably produce an output power of as high as about 100 mW with a single diffraction limited beam corresponding to a 0° phase-shift mode.

This invention is not limited to the above-mentioned example, but it is, of course, applicable to devices having a lasing structure different from that of the above-mentioned example, devices having a polarity different from that of the above-mentioned example, devices using semiconductor materials therein different from those of the above-mentioned example, devices in which the oscillation operating area and the non-oscillation operating area are electrically isolated therebetween, devices in which the materials for the oscillation operating area are different from those of the non-oscillation operating area, and devices in which the length of one of the waveguides in the non-oscillation operating area is zero.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising an oscillation operating area provided with a plurality of first index-waveguides in a parallel manner: a non-oscillation operating area provided with a plurality of second index-waveguides in a parallel manner connected or coupled to said oscillation operating area, where each second index-waveguides differs in length from adjacent parallel second index-waveguides, said oscillation operating area and said non-oscillation operating area being formed monolithically and arranged such that laser beams are guided through said first index-waveguides from said oscillation operating area to the end facets of said second index-waveguides, where the other facets of said second index-wveguides function not as cavity facets of the laser but as the light-emitting facets of the device.

2. A semiconductor laser array device according to claim 1, wherein said oscillation operating area comprises an active layer and a current and light blocking layer positioned above said active layer, said first index-waveguides formed within said active layer corresponding to a plurality of parallel channels in said current and light blocking layer, and said second index-waveguides composed of a plurality of parallel light-permeable ridges which have a refractive index larger than 1 and which extend along the direction of said first index-waveguides.

3. A semiconductor laser array device according to claim 1, wherein the proportion of light reflected from the light-emitting facets of said second index-waveguides is 3%.

* * * * *